(12) United States Patent
Gentile et al.

(10) Patent No.: US 9,123,018 B2
(45) Date of Patent: Sep. 1, 2015

(54) SYSTEM AND METHOD FOR IDENTIFYING ONE OR MORE OBJECTS HUNG FROM A DISPLAY PEG

(71) Applicant: T-Ink, Inc., New York, NY (US)

(72) Inventors: John Gentile, Montclair, NJ (US); Terrance Z. Kaiserman, Loxahatchee, FL (US); Steven Martin Cohen, New York, NY (US); Daniel P. Lawrence, Ann Arbor, MI (US)

(73) Assignee: T+Ink, Inc., New York, NY (US)

( * ) Notice: Subject to any disclaimer, the term of this patent is extended or adjusted under 35 U.S.C. 154(b) by 0 days.

(21) Appl. No.: 14/209,236

(22) Filed: Mar. 13, 2014

(65) Prior Publication Data

US 2015/0048161 A1    Feb. 19, 2015

Related U.S. Application Data

(60) Provisional application No. 61/778,629, filed on Mar. 13, 2013.

(51) Int. Cl.
*A47F 5/08* (2006.01)
*G06K 7/08* (2006.01)
(Continued)

(52) U.S. Cl.
CPC .............. *G06Q 10/087* (2013.01); *G01R 27/02* (2013.01); *G06K 7/08* (2013.01); *A47F 5/0823* (2013.01); *A47F 2010/005* (2013.01)

(58) Field of Classification Search
CPC ................ A47F 5/0823; A47F 5/0861; A47F 2010/005; G01R 27/02; G06Q 10/087; G06K 7/08

USPC .......... 235/375, 385, 451, 439, 440; 340/568.1, 572.1, 572.3–572.5, 572.7, 340/572.8, 5.91; 248/220.31, 248/220.41–220.43; 211/7, 48, 54.1, 59.1, 211/87.01, 103, 105.1, 105.2, 106.01, 123
See application file for complete search history.

(56) References Cited

U.S. PATENT DOCUMENTS

| | | | |
|---|---|---|---|
| 2,992,625 | A | 7/1961 | Eckenbach |
| 3,426,326 | A | 2/1969 | Goldstein |

(Continued)

FOREIGN PATENT DOCUMENTS

| | | |
|---|---|---|
| WO | WO 00/65532 | 11/2000 |
| WO | WO 2012/176788 | 12/2012 |

OTHER PUBLICATIONS

International Search Report from PCT/US14/26827, mailed Sep. 25, 2014.

*Primary Examiner* — Michael G Lee
*Assistant Examiner* — Suezu Ellis
(74) *Attorney, Agent, or Firm* — Wolf, Greenfield & Sacks, P.C.

(57) ABSTRACT

Systems and methods for identifying one or more objects hung from a display peg are described herein. The system may include a display peg comprising a first and second electrically conductive terminal. An object comprising a resistive element having a preselected resistance may be hung from the display peg such that the resistive element is in electrical communication with the terminals. A source may be configured to provide a current that flows from the first terminal through the resistive element to the second terminal. An electronic device may be configured to detect the current flowing from the second terminal. The system may be configured to identify the type of object depending on the preselected resistance of the resistive element.

19 Claims, 8 Drawing Sheets

(51) Int. Cl.
  *G06Q 10/08* (2012.01)
  *G01R 27/02* (2006.01)
  *A47F 10/00* (2006.01)

(56) References Cited

U.S. PATENT DOCUMENTS

| | | | |
|---|---|---|---|
| 4,673,932 A | 6/1987 | Ekchian et al. | |
| 4,881,061 A | 11/1989 | Chambers | |
| 5,407,050 A | 4/1995 | Takemoto et al. | |
| 5,763,058 A | 6/1998 | Isen et al. | |
| 5,771,003 A | 6/1998 | Seymour | |
| 5,801,628 A | 9/1998 | Maloney | |
| 6,164,617 A * | 12/2000 | Butterfield et al. | 248/690 |
| 6,198,391 B1 | 3/2001 | DeVolpi | |
| 6,827,256 B2 | 12/2004 | Stobbe | |
| 6,837,427 B2 | 1/2005 | Overhultz et al. | |
| 7,021,535 B2 | 4/2006 | Overhultz et al. | |
| 7,102,519 B2 * | 9/2006 | Lyon et al. | 340/572.1 |
| 7,233,241 B2 | 6/2007 | Overhultz et al. | |
| 7,510,123 B2 | 3/2009 | Overhultz et al. | |
| 7,535,337 B2 | 5/2009 | Overhultz et al. | |
| 7,584,016 B2 * | 9/2009 | Weaver | 700/213 |
| 7,775,130 B2 | 8/2010 | Harish et al. | |
| 8,056,738 B2 | 11/2011 | Phillips | |
| 8,321,304 B2 | 11/2012 | Khan et al. | |
| 8,448,521 B2 | 5/2013 | Washeleski et al. | |
| 8,473,374 B2 | 6/2013 | Allison et al. | |
| 8,915,430 B2 * | 12/2014 | Shah et al. | 235/383 |
| 2004/0195319 A1 * | 10/2004 | Forster | 235/385 |
| 2005/0040934 A1 | 2/2005 | Shanton | |
| 2007/0069867 A1 | 3/2007 | Fleisch et al. | |
| 2008/0052198 A1 | 2/2008 | Hosokawa | |
| 2009/0020601 A1 * | 1/2009 | Woodbury et al. | 235/375 |
| 2009/0311456 A1 | 12/2009 | Harris | |
| 2009/0313365 A1 | 12/2009 | Whitehead | |
| 2010/0049635 A1 | 2/2010 | Delaney et al. | |
| 2011/0210030 A1 | 9/2011 | Londo et al. | |
| 2011/0218889 A1 | 9/2011 | Westberg et al. | |
| 2011/0259953 A1 | 10/2011 | Baarman et al. | |
| 2011/0259960 A1 | 10/2011 | Baarman et al. | |
| 2012/0053725 A1 | 3/2012 | Niederhuefner et al. | |
| 2012/0169230 A1 | 7/2012 | Lowenthal et al. | |
| 2012/0228240 A1 | 9/2012 | Gentile et al. | |
| 2012/0245969 A1 | 9/2012 | Campbell | |
| 2012/0293330 A1 | 11/2012 | Grant et al. | |
| 2013/0048724 A1 | 2/2013 | Burnside et al. | |
| 2013/0107413 A1 | 5/2013 | Moore | |
| 2013/0314210 A1 | 11/2013 | Schoner et al. | |
| 2015/0041537 A1 | 2/2015 | Gentile et al. | |
| 2015/0041616 A1 | 2/2015 | Gentile et al. | |

* cited by examiner

SYSTEM AND METHOD FOR IDENTIFYING ONE OR MORE OBJECTS HUNG FROM A DISPLAY PEG

RELATED APPLICATIONS

This application claims priority under 35 U.S.C. §119(e) to U.S. Provisional Patent Application Ser. No. 61/778,629, filed Mar. 13, 2013, and entitled "Automatic Sensing Methods and Devices for Inventory Control," which is incorporated herein by reference in its entirety for all purposes.

TECHNICAL FIELD

Systems, methods, and devices for tracking inventory are generally described.

BACKGROUND

Conventional displays, such as point-of-purchase displays having a base pegboard and display hardware, are either shipped assembled or assembled in the field. Conventional displays contain a limited and specific functional capability, with the modifiable elements limited to the placement of shelves, racks, and corresponding pegs upon which products are placed and displayed. Such conventional point-of-purchase displays offer little, if any, functionality related to product sensing and inventory control.

SUMMARY

Systems, methods, and devices for tracking inventory are generally described. The subject matter of the present invention involves, in some cases, interrelated products, alternative solutions to a particular problem, and/or a plurality of different uses of one or more systems and/or articles.

In some embodiments, a system is described. The system comprises, in certain embodiments, a display peg; and an object comprising a resistive element having a preselected resistance, the resistive element in electrical communication with the display peg when the object is hung from the display peg.

Certain aspects relate to a method. The method comprises, in some embodiments, determining the identity of an object hung from and in electrical communication with a display peg, via a change in electrical current flowing through the display peg, wherein the object comprises a resistive element with a preselected resistivity.

In some embodiments, the method comprises determining the quantity of objects hanging from and in electrical communication with a display peg via a change in electrical current flowing through the display peg, wherein the objects comprise a resistive element with a preselected resistivity.

Certain aspects relate to an article of manufacture for displaying one or more electronically identifiable objects. The article comprises, according to certain embodiments, a display peg comprising a first segment configured to transmit a first electrical signal from the display peg when an object is placed in electronic communication with an electrically conductive terminal of the first segment; and a second segment configured to transmit a second electrical signal from the display peg when an object is placed in electronic communication with an electrically conductive terminal of the second segment.

The article comprises, in some embodiments, a display peg, comprising a first electrically conductive terminal, a second electrically conductive terminal, and a third electrically conductive terminal. In some such embodiments, the first and second terminals are adapted to permit for an electrical current to flow therebetween when a first object, having a resistive element arranged on the point of contact between the object and the display peg, is hung from the display peg; and the first and third terminals are adapted to permit for an electrical current to flow therebetween when a second object, having a resistive element arranged on the point of contact between the object and the display peg, is hung from the display peg.

In some embodiments, the article comprises a display peg, and two electrically conductive terminals laterally aligned along an upper surface of the display peg, the terminals adapted to permit for an electrical current to flow therebetween when an object, having a resistive element printed on the point of contact between the object and the upper surface of the display peg, is hung from the display peg.

In some embodiments, a method of electronically identifying one or more objects hung on a display is described. The method comprises, according to certain embodiments, providing a display peg, the display peg comprising two electrically conductive terminals laterally aligned along an upper surface of the display peg; and hanging an object on the display peg, the object comprising a printed resistive element having a preselected resistance, wherein upon hanging the object on the display peg, the resistive element contacts each of the electrically conductive terminals such that an electrical current is capable of flowing between the electrically conductive terminals via the resistive element.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

The present disclosure is generally directed to methods of tracking stocked inventory, such as products or other items stocked on a store shelf or other storage space. The disclosure is also directed to devices and systems that may be utilized to carry out such methods.

One aspect of the disclosure provides for a method of electronically identifying one or more objects hung on a display. For purposes of this disclosure, no differentiation is made between the object and the object's packaging. In other words, a packaged product and the packaging may together be considered to be the "object" described by the disclosure. The method may include providing a display hook protruding from the display, the display hook comprising a support structure and two electrically conductive terminals formed, printed, or in-molded on the surface support structure. The method may also include providing an object capable of being hung on the display hook. The object may comprise a resistive element having a preselected resistance. The resistive element may be printed, formed, or in-molded on a portion of the object that contacts the display hook when the object is hung on the display hook. The method may further include hanging the object on the display hook in manner such that the resistive element of the object makes electrical contact with each of the electrically conductive terminals such that an electrical current is capable of flowing between the electrically conductive terminals via the resistive element.

The present disclosure is applicable to many types of displays. For example, the display may be a wall, a shelving unit or a pegboard display, or any other structure on which a hook may be mounted such that the hook extends outward from the structure and an object may be hung on the hook. In any of the above examples, parts of the display may include electrical wiring. The electrical wiring may include standard electrical cables known in the art and/or stripes of conductive ink printed or formed onto the display. The electrical wiring may be included on the front or back of the display, or both. Including the wiring on the back of the display may be beneficial since a person such as a customer in a store will observe the products or objects hung on the display from the front of the display, and may not see the wiring in the back. For reasons described in greater length below, the wiring may be communicatively coupled to electronic devices, for example as part of an inventory tracking system. The electronic devices may include, for example, a system controller, a shelf antenna, a database server, and so on.

Figure 3:
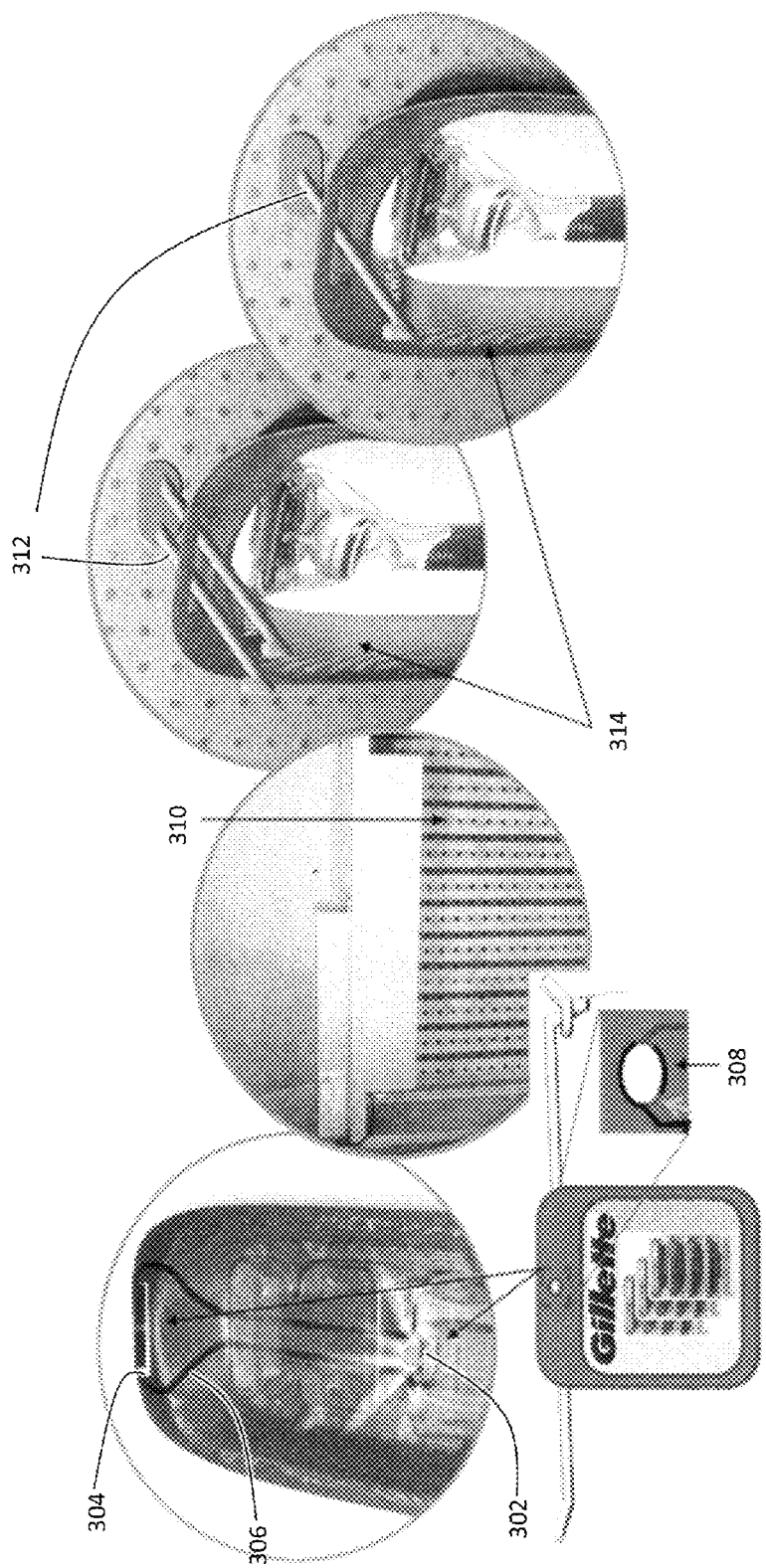
FIG. 3 includes photographs illustrating the interconnection between an object, a hook, and a pegboard, according to some embodiments.

In the example of the pegboard display, the electrical wiring may run in vertical or horizontal (or sometimes other directions) stripes. The wiring may be coupled to each of the holes in the pegboard. For example, in FIG. 3, the back of pegboard 310 can include electronic ink in series to provide instant contact to inserted hooks (or pegs). If the pegboard holes are a boxed array (as shown in FIG. 3), then the wiring may be organized such that every peghole in a first vertical column is coupled to a first wire, and every peghole in the next adjacent column is coupled to a second wire. The first wire may be coupled to the electronic devices, and the second wire may be grounded. In some examples, the first wires may alternate with the second wires. In other examples, each first wire may be coupled to a different electronic device (e.g., separate tracking systems for each column of pegholes). The same system may apply for wiring in horizontal rows instead of vertical columns (e.g., alternating horizontal wiring stripes). The wiring may be patterned differently if the pegholes are arranged in a different array. For example, if the pegholes follow a hexagonal pattern, the wiring may be arranged alternatingly as described above but along a diagonal line. Alternatively, the wiring may still be arranged vertically or horizontally, but more rows/columns of wiring will be required to cover every peghole (in some examples, some pegholes may be skipped, for example if not every row or column of pegholes is expected to receive hooks).

In addition to the above described wires, the electrical wiring may include ribbon cables (e.g., a 16 pin connector). Each of the ribbon cables may include multiple ribbon connectors, where a ribbon connector is aligned with each peghole (or at least each peghole that receives a display hook) coupled to that ribbon cable. The ribbon connector may accommodate (e.g., be capable of receiving) a second ribbon cable that is affixed to the respective display hooks that fit into those pegholes coupled with the first ribbon cable. In this manner, multiple electrical wires may be connected from a single hook to the electrical wiring at a single peghole-hook interface. This therefore allows for multiple electrical signals to be transmitted between the electronic devices and a single hook and/or a product/object hanging from the hook.

In some examples, the ribbon connector may be located within about a centimeter of the peghole such that the ribbon cables of the hook and display wiring can be properly aligned with and coupled to one another. The electrical wiring of the display may be crimped to the ribbon connector in order to establish electrical connection. The interface between the electrical wiring on the display and a hook may also include a z-axis electrically conductive glue or tape.

FIG. 3 illustrates hooks (or pegs) 312 inserted into pegboard 310. In addition, in FIG. 3, products 314 are hung on hooks 312. Two or more electrodes can provide the ability to measure total resistance across them to count and verify inventory, track refill removal, and verify correct product placement, as described in more detail below.

In addition to (or alternative to) the electrical wiring, the display may include coils for wireless power transfer and/or wireless communication. Like with the electrical wiring, each coil may electrically charge a component included in the objects (e.g., an RFID chip, a resistive element, an LED included in the object packaging) and/or information may be wirelessly communicated therebetween (e.g., an ID of the object). The wireless charging and communication may be bidirectional. In some examples, a transmitter coil may be mounted to the back of the display and a receiver coil may be embedded within the packaging of an object such that electrical wiring need not be run along the hook to communicatively connect the object to the electronic devices.

Figure 6:
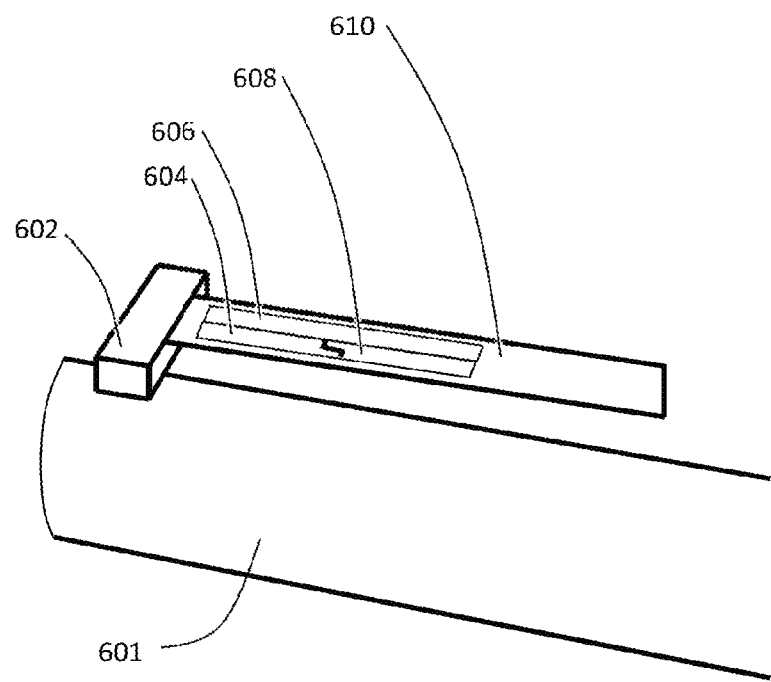
FIG. 6 is, according to some embodiments, a schematic illustration of a display hook.
Figure 7:
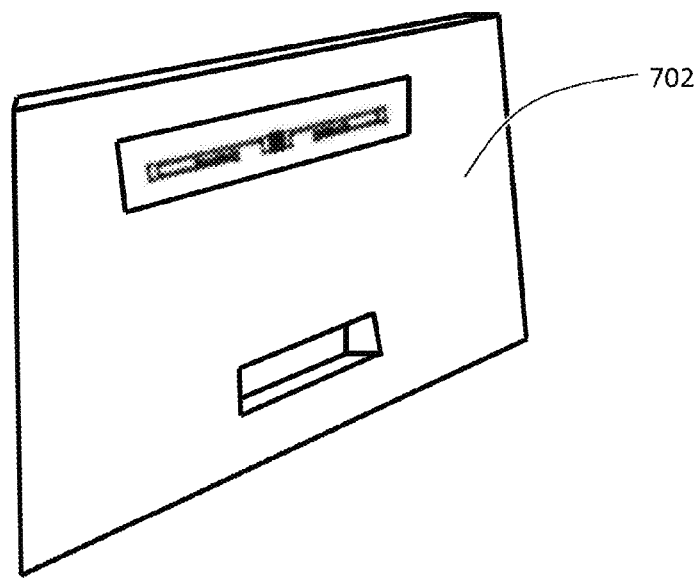
FIG. 7 is a schematic illustration of a tail unit of a hook, according to some embodiments.

The display hook (or peg) may comprise a support structure. The support structure may be made of a plastic or metal or other rigid material core. For example, in FIG. 6, the display hook comprises support structure 601. The support structure may be covered with a flexible peg sleeve. The sleeve may be adhesive backed in order to permit for the sleeve to remain affixed to the support structure. For example, FIG. 6 illustrates flexible peg sleeve 610, prior to being affixed to support structure 601. The sleeve may be fitted to the hook using a shrink film such as a heat shrink wrap. In other examples, described below, the hook may be formed without using any sleeve. In FIG. 6, the display hook further comprises ribbon connector 602. The display hook in FIG. 6 can be connected to tail unit 702, illustrated in FIG. 7.

Figure 1A:
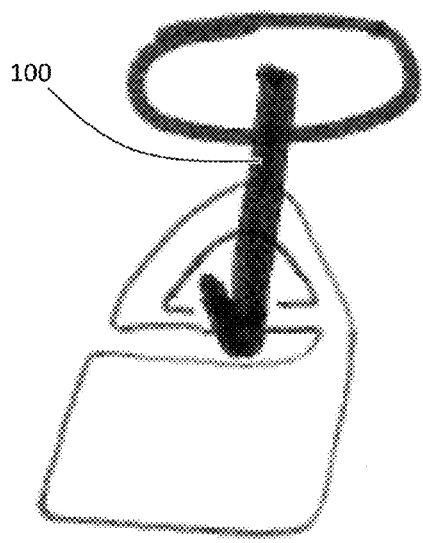
FIGS. 1A-1D are, according to certain embodiments, schematic illustrations of hooks.
Figure 1B:
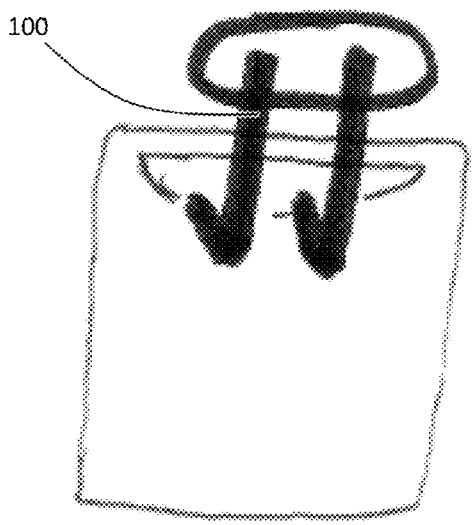
Figure 1C:
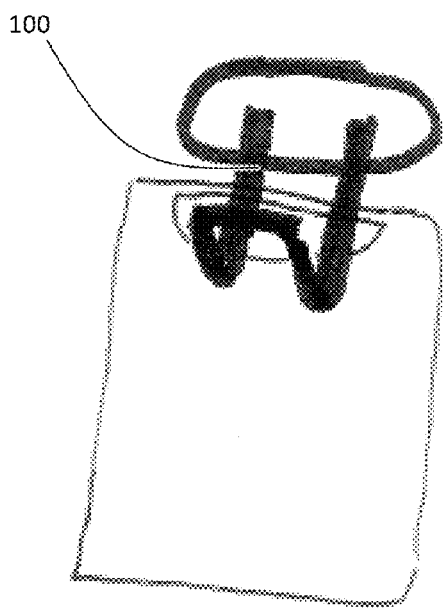
Figure 1D:
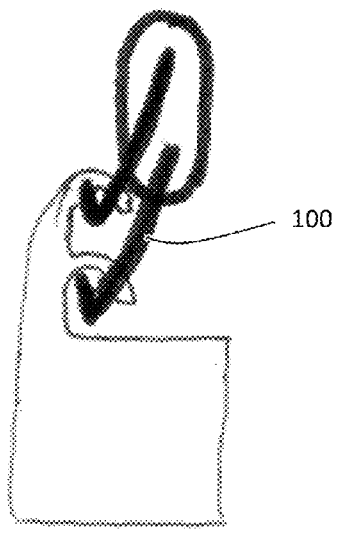
Figure 2A:
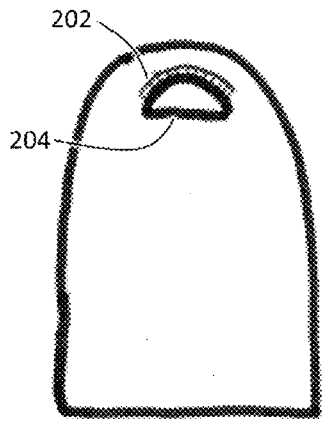
FIGS. 2A-2I are schematic illustrations of resistive elements, according to some embodiments.
Figure 2B:
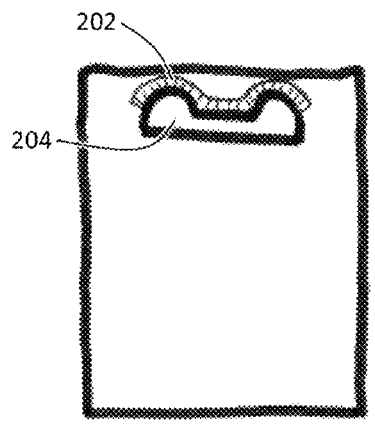
Figure 2C:
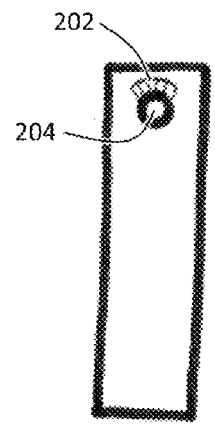
Figure 2D:
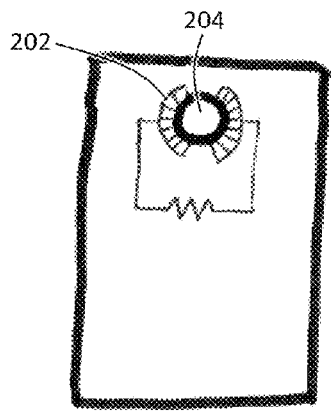
Figure 2E:
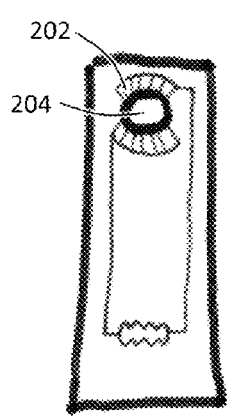
Figure 2F:
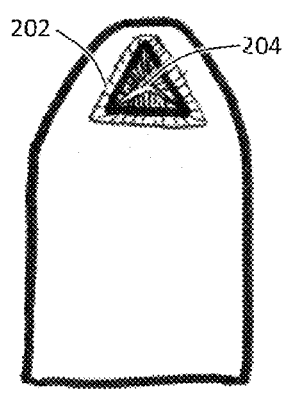
Figure 2G:
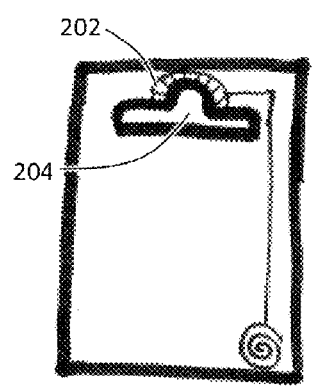
Figure 2H:
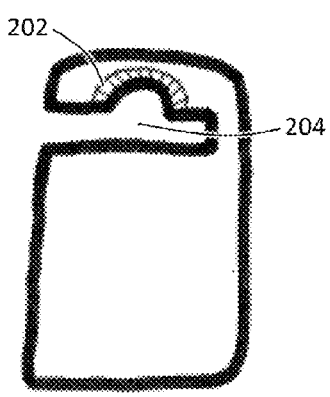
Figure 2I:
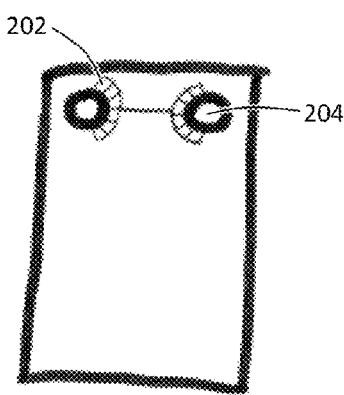

The display hook may come in any of various shapes and sizes. FIGS. 1A-1B illustrate some of the types of display hooks 100 that are applicable to this disclosure, such as a single rod straight hook (FIG. 1A), a double rod straight hook (FIGS. 1B and 1D), and a U-shaped hook (FIG. 1C). Other hooks applicable to the disclosure include brackets and straight rods without any hook at the end. While the illustrated rods are all substantially straight, parallel to the floor, and orthogonal to the display, other display hooks applicable to the disclosure may be more curved (such that any object hung on the hook slides to the minimum of the curve) and/or tilted (such that any object hung from the hook slides to the back or to the front of the hook).

Returning focus to the sleeve, the sleeve may include electrical terminals. For example, referring to FIG. 4, hook 402 can comprise positive electrical terminal 406 and negative electrical terminal 408. The electrical terminals may be formed, printed, or otherwise fashioned (e.g., in-molding, etc.) using conductive inks or conventional circuits and circuit boards. A method by which conductive inks may be printed or formed or in-molded on surfaces has been taught in, for example, U.S. Pat. No. 8,198,979, issued Jun. 12, 2012, the disclosure of which is hereby incorporated by reference herein in its entirety. The in-molding process may involve first printing the electrical terminals on a film and then injection molding the hook into the cavity of the film. Alternatively, the electrical terminals may be printed on a release paper, instead of a film, inside the injection mold. Using a release paper will cause the terminals to be molded to the outer surface of the hook without being sealed in or covered by the film.

In some examples, the sleeve may be a woven shrink wrap. The woven wrap may be fitted to the hook by sliding the wrap over the hook and then stretching the wrap lengthwise such that the diameter of the wrap constricts (similar to a Chinese finger trap). One or more electrically conductive threads or wires may be embedded in the wrap such that a first end of the wire touches the interface between the hook and the display (e.g., fits into a ribbon connector, contacts a z-axis adhesive on the front surface of the display, is crimped to an electrical wire behind the display, etc.) and the second end of the wire extends or pokes out of the sleeve at a location where an object may be hung. In this way, the wrap may function as an electrically conductive terminal for contacting an object hung on the hook to the display (and further to the electronic devices connected to the display).

Some conductive terminals may be ground terminals, while others may be coupled to the electronic devices. Each terminal may be electrically coupled via the electrical wiring in the display (e.g., via a circuit board, via conductive ink traces). In an example having several electrical terminals in a hook, each terminal may be coupled through the display using a ribbon cable and connector. As such, each terminal may provide a separate electrical signal.

The present disclosure generally applies to hooks that have at least two electrical terminals. One of the electrical terminals may be a ground terminal, grounded through the electrical wiring. The other terminal may be connected (e.g., electronically coupled) to the electronic devices such that information may be transmitted both ways between the electronic devices and a product or object hanging on the hook. The hook itself may include one or more electronic devices coupled to the terminals and to the electrical wiring (for example, as described below, the hook may include one or more LED lights capable of conveying information regarding the objects hanging on the hook or capable of conveying other information received from the electronic devices).

In some examples, at least one of the terminals may be replaced by a wireless coil. For example, the object may receive an electrical signal wirelessly at a receiver coil and then carry an electrical current from the receiver coil to a resistive element that is coupled to the hook from which the object hangs (or to another coil, such as a transmitter coil, to further wirelessly transmit the received signal).

In some examples, the electrical terminal coupled to the electronic devices may be segmented into multiple separate segments. Each segment may be capable of transmitting its own unique electrical signal, effectively establishing several electrical terminals on a single hook. For example, referring to FIG. 6, the hook includes a common rail 606, a first electrical terminal segment 604, and a second terminal segment 608.

The terminals may be placed on the surface of the support structure of the hook such that an object hung from the hook contacts the surface of the hook at the terminal. In some examples, the terminal is placed along the top surface. Some of these examples are shown in the accompanying illustrations in FIGS. 1A-1D. In other examples, for instance where the object hung from the hook is hung by a narrow hole that touches the hook on all sides of the hole, the terminal may be placed along any surface of the hook. It is generally preferable, however, to place the terminal along the upper surface since the gravitational force exerted on the object hanging from the hook generally provides for the most reliable electrical connection along the top surface of the hook.

If the hook is a single rod straight hook, each of the terminals may be formed along the top surface of the rod. Each surface may extend along the length of the rod, either along the entire length or a substantial portion of the length (e.g., half, most, 90%, up to the curved part of the hook, etc.). If a terminal is divided into several segments, each segment may occupy a distance along the length of the rod such that at any cross-section of the length of the rod, there are exactly two terminals, a ground terminal and an active terminal.

If the hook is a double rod straight hook, each rod may include a terminal. In other words, the ground terminal may be formed on the left rod and the active terminal on the opposing right rod, or vice versa. Alternatively, the terminals may be formed on the same rod of the double hook.

In some examples of the disclosure, a cross-section of a hook (one rod or two) may include more than two terminals. For instance, one terminal may be connected to ground while the other terminals may each be connected to different electronic devices (e.g., one terminal to a server, to an LED, to an alarm, to an antenna for wireless communications, etc.). In such an example, each of the terminals along the cross-section may provide the same electrical signal or different electrical signals to the electronic devices respectively.

In an example where the terminal is segmented along the length of the rod, the segments may be spaced such that one object fits per segment. For example, if a hook is designed to receive a packaged razor, and the packaging of each razor is about 2 inches thick (i.e., about 5 razors can fit on a rod that is 10 inches long), then each segment may be about 2 inches long such that each razor packaging, when hung from the rod, touches a different segment of the active electrical terminal. In this manner, each razor packaging may send a different electrical signal through the rod to the electrical devices. In these examples, each segment may be connected to a different respective wire of the second ribbon cable.

While the above examples applied to a rod or hook having a flexible sleeve, in other examples, the wiring (e.g., conductive ink traces) may be printed/formed/in-molded directly to the rod/hook itself without any need for adhesive backing.

The object (that is, the object itself or its packaging) may include a resistive element. The resistive element, like the other wiring of the present disclosure, may be formed using conductive inks. The resistive element may be formed/printed or otherwise fashioned onto the object on a portion of the object that contacts the hook when the object is hung from the hook. In this fashion the resistive element may complete an electrical connection between the terminals included in the hook along a given cross-section of the hook. For example, as illustrated in various of FIGS. 2A-2C and 2E-2H, the resistive element 202 may be formed at the top of loop 204 such that both terminals contact the resistive element. It may be beneficial for the loop by which the object hangs to be curved such that good contact is made between the terminals of the hook and the resistive elements of the object (as opposed to if the loop were flat and the object could slide side to side on the hook).

The examples shown in FIGS. 2A-2I are not meant to be limiting to the disclosure but rather to show the many ways in which the resistive element may be configured in order to contact the terminals of the hook. The object may include a loop with an arched top (e.g., FIG. 2A), such that a single rod hook having a terminal along its top surface would contact the top of the loop. Some objects may include loops with two arches for hanging on double straight rod hooks (e.g., FIG. 2B). Some objects may include a narrow loop (e.g., FIGS. 2C-2E). Because the narrow loop may contact all surfaces of the hook, the resistive element may be placed anywhere along the narrow loop (and for that matter anywhere along the circumference of the hook) The resistive element may directly connect the two terminals (e.g., FIG. 2C), may connect the terminals through a more conventional resistive element (e.g., FIG. 2D), and may provide other electrical components (e.g., an RFID tag) between the resistive elements such that the other electrical components are serially connected between the terminals (e.g., FIG. 2E). Instead of a conventional loop, the object may include a slit that opens when the object is placed on the hook enough for the object to be received by the hook and maintain electrical contact between the hook and all or any sides of the slit (e.g., FIG. 2F). In some examples, the object may include one or more wireless receiver coils coupled to a resistive element, such that the resistive element establishes an electrical connection between a wire terminal in the hook and a wireless transmitter (e.g., in the display) (e.g., FIG. 2G). In some examples, the object may include an open slit instead of a loop (e.g., FIG. 2H), or multiple loops electrically connected to one another (e.g., FIG. 2I).

In addition to the above described resistive elements, the object may include a radio frequency identifier (RFID) capable of emitting a radio frequency signal. In some examples, the RFID may be a passive RFID, that is, the identifier is powered by an outside frequency source. For instance, if the RFID is included in the object, the object may be scanned by a store clerk, and the scanner may activate the RFID such that the scanner can read the information contained in the RFID circuitry. Alternatively, the RFID may be activated by a scanner stationed at the entrance and/or exit of the store such that an alarm may be sounded by activation of the RFID (e.g., in response to energy provided by the scanner, the RFID generates its own signal that is detected either by the scanner or by another receiver which then activates the alarm). In some examples, the RFID may be activated by a wireless receiver included in the object and coupled to the RFID. The RFID circuitry may contain about 96 bits or more of information. 96 bits may be enough information to provide a unique ID for every product in a given store (a total of $2^{96}$ possible IDs). Passive RFID technology is well established and may be used for long range detection. However, passive RFID, in some applications, may be prohibitively expensive.

In other examples, the RFID may be a chipless RFID. The chipless RFID may also provide a unique ID having between about 2 to about 8 bits, or in some examples more bits. While chipless RFIDs are generally short range devices (e.g., scannable from about 10 feet away), the RFIDs may be coupled to long range antennae in order to give the signal a higher range (e.g., a hundred feet, several hundred feet, etc.). The chipless RFID may also be passive (i.e., does not generate its own signal without being provided with an external power source). The resonating circuitry of the RFID may be as small as about 4 microns in diameter, making inclusion of the circuitry in packaging of an object or in the object itself both feasible and cost effective. Data may be captured from this technology at a relatively fast rate (e.g., about one bit in two microseconds).

In some examples, the RFID may be electrically coupled to the resistive element. For instance, hanging the object on a hook may establish an electrical connection between two terminals of the hook using two separate resistive elements, with the RFID serially connected between the resistive elements. In this manner, the RFID may be powered by a power source or battery connected to the active terminal. Alternatively, the RFID may transmit information over the active terminal to a connected electronic device (e.g., automatically, when powered by a scanner, when powered by a battery coupled to one of the terminals). In one such example, a cross-section of the hook may include three or more terminals, where one terminal provides a power source, one terminal is grounded, and a third terminal receives information from the RFID. The information may indicate the identity of the object, or other information related to the object (e.g., brand, model number, color, cost, etc.).

FIG. 3 provides an illustration of how the resistive element may be positioned on a loop or other hanging means/mechanism included in the razor packaging such that an RFID device is connected to the terminals. In the leftmost picture, an electrical connection between the RFID (small oval 302 at the bottom of the picture) and the loop (white slit 304 at the top of the picture) is formed by wiring (bold curvy lines 306). In some embodiments, solid or segmented conductive ink 308 can be used. The conductive ink can be sensing or power providing.

Figure 5:
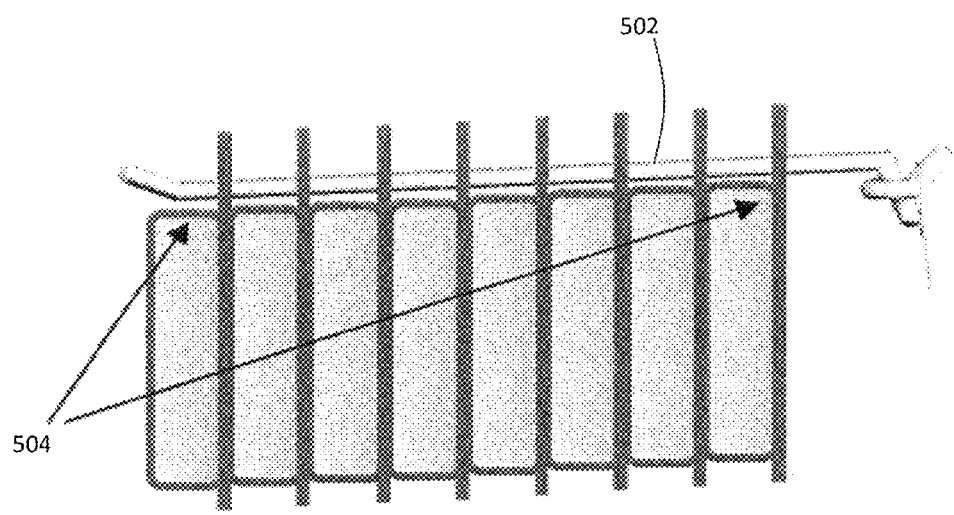
FIG. 5 is a schematic illustration showing multiple products hung on a single hook, according to certain embodiments.

As shown in FIG. 5, multiple products 504 may be hung on a single hook 502, according to certain embodiments. In the exemplary embodiment illustrated in FIG. 5, each package may have a 10Ω resistance, and the hook may have a 1.25Ω resistance.

In some examples of the disclosure, the resistive element may work in tandem with the RFID. For example, the resistive element may provide information to the connected electronic devices while the RFID provides other information to a handheld scanner. In one such example, a person may scan an object hanging on the hook. Scanning the object may identify the precise identity of the object (e.g., a 96 bit ID) or may identify a general identity that may belong to a small pool of possible objects (e.g., an 8 bit identity). Scanning the object may not indicate how many of that object is hanging on the particular hook scanned. However, the resistive element may provide information to the electronic devices indicating the quantity of an object hanging on a given hook. The scanner may be equipped with an antenna for communicating with the same electronic devices as the hook, such that the electronic devices may receive information from both the resistive element via the display wiring as well as from the RFID via the scanner. As such, the electronic devices may determine the type of object scanned and how many of the object are on a given hook.

Determining the quantity of an object on a given hook may be accomplished in one of several ways. One determining process involves hanging several objects on a hook having only one active terminal and one ground terminal. Each object may have a resistive element with a preselected resistivity. Therefore, if two of the same object are hanging on the hook, the equivalent resistance between the terminals will be half of that if only one of that object were hanging on the hook. Given a known voltage drop across the terminals, the amount of electrical current traveling between the terminals may indicate the quantity of an object on the hook.

For illustrative purposes, each Gillette® Fusion® razor may be packaged in packaging having a 10 kΩ resistive element, while each Gillette® MACH3® razor may include a 20 kΩ resistive element. These resistive values may be preprogrammed into the electronic devices. Therefore, if a 10V battery source is provided to a hook holding one of these two products, the electronic device may interpret a 1 mA electrical current to mean that one Fusion® or two MACH3® razors are hanging on the hook. By scanning any object on the hook, the electronic device may determine whether Fusion® or MACH3® razors are hanging on the hook, thereby determining the quantity and type of object on the hook.

In other examples, the active terminal may be separated into separate segments such that each segment may have a different electrical current traveling across that segment. In those examples, if several Fusion® razors were placed on such a hook, each terminal would have a 1 mA current traveling across. If every object that could be hung from that hook would have a unique resistive element having a unique resistive value, the electronic device could determine the object hanging from each segment from each hook without any information from a scanner. Alternatively, even if every product were to include a resistive element having the same resistive value (e.g., 10 kΩ), the electronic device could determine the quantity of the object hanging from each hook without knowing the identity of the object, and may further receive information regarding an object's identity from the scanner. In this manner, the electronic device may assume that every object on a hook is identical and use the identity information from a scanner that scans the front object on a hook to determine the identity of every object on the hook. As such, if there are fifty Fusion® razors in a store, five hooks having ten razors each, a person would only have to scan the front five razors in order for an electronic inventory management device to determine that there are fifty Fusion® razors in the store. This would significantly reduce the amount of manual work needed to collect inventory information in the store.

The above described system may also be capable of determining when an object is placed on the wrong hook. For example, if one Fusion® razor and one MACH3® razor were both placed on the same hook, the equivalent resistance of the razors would equal about 6.67 kΩ. As such, in the example where the hook includes only one active terminal and one ground terminal, a 10V drop across the terminals would result in a 1.5 mA current. Since the 1.5 mA current would not match any of the currents that the controller expects to detect if one a single product were hung from the hook, the system may determine that two different products are hanging from the hook. The system may then alert a person (e.g., an employee of the store) to investigate the hook and move an object off the hook and back to its proper hook.

While the above examples relate specifically to objects having resistive values associated therewith, the disclosure applies similarly to objects having capacitive values or RC values (e.g., where the voltage provided from the controller is alternating having a range of frequencies, and an AC current produced may be used to identify the object).

The Electronic Devices

Turning next to the electronic devices coupled to the hook and wirelessly coupled to the scanner, the electronic devices may include any combination of servers, computers, antennae, alarms, etc. to form a distributed monitoring system. The electronic devices may include a system controller capable of providing an electrical signal (such as the 10V signal described above) to each of the display hooks, and further capable of interpreting an electrical signal received from the display hooks. The electrical signal may be an electrical current, the value of which may indicate the quantity and/or type of object hung from a given hook. In other examples, the electrical signal may be more complex than a DC current (e.g., an alternating current having a certain frequency, a series of bits having a unique or semi-unique identity, etc.). The controller may relay the received information to a server, where inventory of the object, as well as other objects, may be gathered, analyzed, and/or stored.

The Scanner

While the above descriptions discuss only a close-range RFID scanner, other types of scanners and object sensing methods are equally applicable to this disclosure. For example, object sensing may be accomplished using capacitive or magnetic methods. In such examples, the object may include a capacitive element having a different dielectric than the surrounding air. The object may then be detected by a radio frequency (RF) signal. As with the resistive elements, each object may include its own unique capacitive element having a capacitive value different than other elements. Further, the resistive and capacitive elements may be coupled to one another to provide an RC circuit having a resonant frequency. This frequency may be used by the controller to identify the object. Capacitive sensing may also include piezoelectric and/or capacitive sensing surfaces.

Optical sensors, such as light guides and photodiodes may also be used to identify and/or sense the presence of objects, such as in an electronic article surveillance system.

Figure 4:
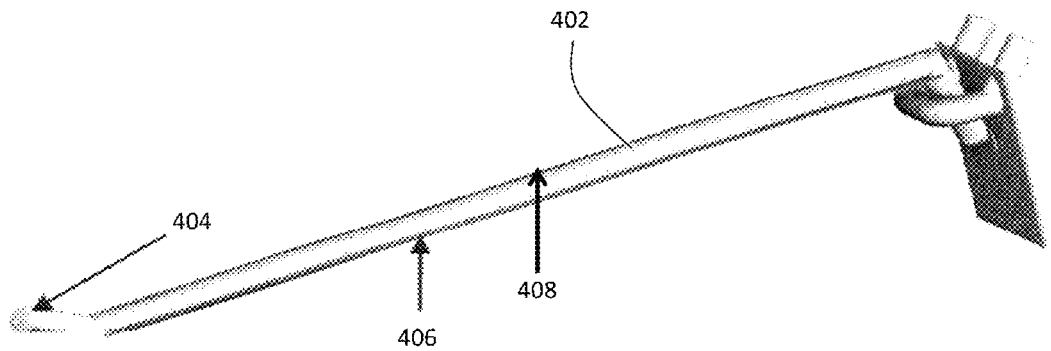
FIG. 4 is, according to certain embodiments, a schematic illustration of a hook.

In one example, every hook may include an LED. For example, in FIG. 4, hook 402 comprises LED 404. The LED may be located at the tip of the hook, as illustrated in FIG. 4, or on the display in proximity to the hook. The LED may change colors to provide visual clues. The LED may turn different colors depending on the status of the hook. For example, if the hook is vacant, the LED may turn a first color (e.g., red). This may indicate that restocking is needed. If the hook has at least one object hanging, or if every terminal on the hook is occupied, the LED may turn a second color different from the first color (e.g., green). If a sensor at the entrance/exit to the store determines that an object was taken through said entrance/exit without being paid for, the sensor may also identify the type of object and the hook from which the object was taken and may relay a signal to the hook (via a network of antenna and/or the display electrical wiring) such that the LED on the hook flashes a color (e.g., flashing red).

In certain embodiments, some or all of the above described technologies can be placed into communication with one another (e.g., shoplifting alarms in communication with an inventory database). The objects may be printed with one or more antenna arrays to wirelessly communicate with controllers, servers, and other electronic devices. As described above, the information communicated via these antennae may include any combination of: product identity (e.g., brand, model, color, cost, promotions, etc.), product quantity (e.g., on a given hook, in a store, availability in a nearby store, etc.), product security (e.g., whether a product was paid for before leaving a store), product location (e.g., via long range wireless scanning using a wifi scanner, wireless power transmission such as witricity, and other network connections, such as a PoE connection, or a line drop connection, to identify the whereabouts of a certain product, for instance to determine whether several shoppers are carrying the product in their carts, suggesting that the product is popular or other shopper preferences), and/or product authentication (e.g., detection of a product having no RFID tag, or no resistive element, or an unknown RFID tag, or an unknown resistive element value). The information may be analyzed by a computer or manually, either off-site or in a back office of a store.

Certain of the systems and methods described herein may be employed in a number of use cases include, for example, as anti-counterfeit measures, to reduce shrinkage, to provide for inventory awareness, to enhance production scheduling, to provide promotional opportunities, and/or to analyze shopper behavior.

For example, when employed in an anti-counterfeit system tagged goods (e.g., goods tagged via RFID) can be monitored during packaging, shelving, storage, at the point of purchase (POP), and/or at the point of sale (POS). In certain embodiments, statistical sampling can greatly reduce ongoing tag costs. For example, if 10 of 100 items are tagged per case/carton, an absence of detecting any tags on a "restocked" shelf can create an alert suggesting counterfeit goods have been substituted for authentic product. In some embodiments, if "tagged goods" appear, but do not match a database of specific IDs, or appear at the wrong location, it may suggest that the goods are counterfeit or gray market goods.

As another example, in certain embodiments, certain of the systems and methods described herein can be employed to reduce shrinkage. For example, certain of the systems and methods described herein can be used to detect known theft events, such as multiple product removal (e.g., when 6 are removed from storage, and only 3 are shelved). In some embodiments, portal monitoring of some or all logical portals will provide enhanced awareness of points of shrinkage.

In some embodiments, certain of the systems and methods described herein can be employed to provide for inventory awareness. Automated sensing can, in some embodiments, greatly reduce out of stock situations by generating automated restock alerts. In some embodiments, a dashboard can be used to determine (e.g., measure and/or quantify) whether product is shipped, received, on floor, and/or back stock.

Certain of the systems and methods described herein can, in some embodiments, be used to enhance production schedules. In some such embodiments, the data collected by automated sensing is pushed to assist operations in production scheduling and logistics. In some embodiments, fulfillment may be completely automated by automatic sensing between supplier and retailer, resulting in thousands of hours of saved labor.

According to some embodiments, certain of the systems and methods described herein can be used to analyze shopper behavior. In some embodiments, certain of the systems and methods described herein can be used to monitor on shelf/point of purchase (POP) product velocity, pick and replace time, and/or count passersby, which can, according to some embodiments, provide insight into the degree of success of product promotions.

Certain of the systems and methods described herein can provide for several levels of automated sensing. For example, in some embodiments, determining whether an object is present may be performed (e.g., using capacitive, magnetic, and/or other sensing methods). In some embodiments, a simple identification (e.g., 2 to 8 bit, low cost identification, such as via chipless RFID) can be performed. In some embodiments, a full identification (e.g., using passive RFID, e.g., to provide 96 bit or higher unique identifications) can be performed, for example, for full featured inventory and authentication. In some embodiments, optical sensing may be performed (e.g., using light guides and/or photodiodes). In some embodiments, sensing may be performed through actuation of piezoelectric or capacitive sensing surfaces.

Figure 8:
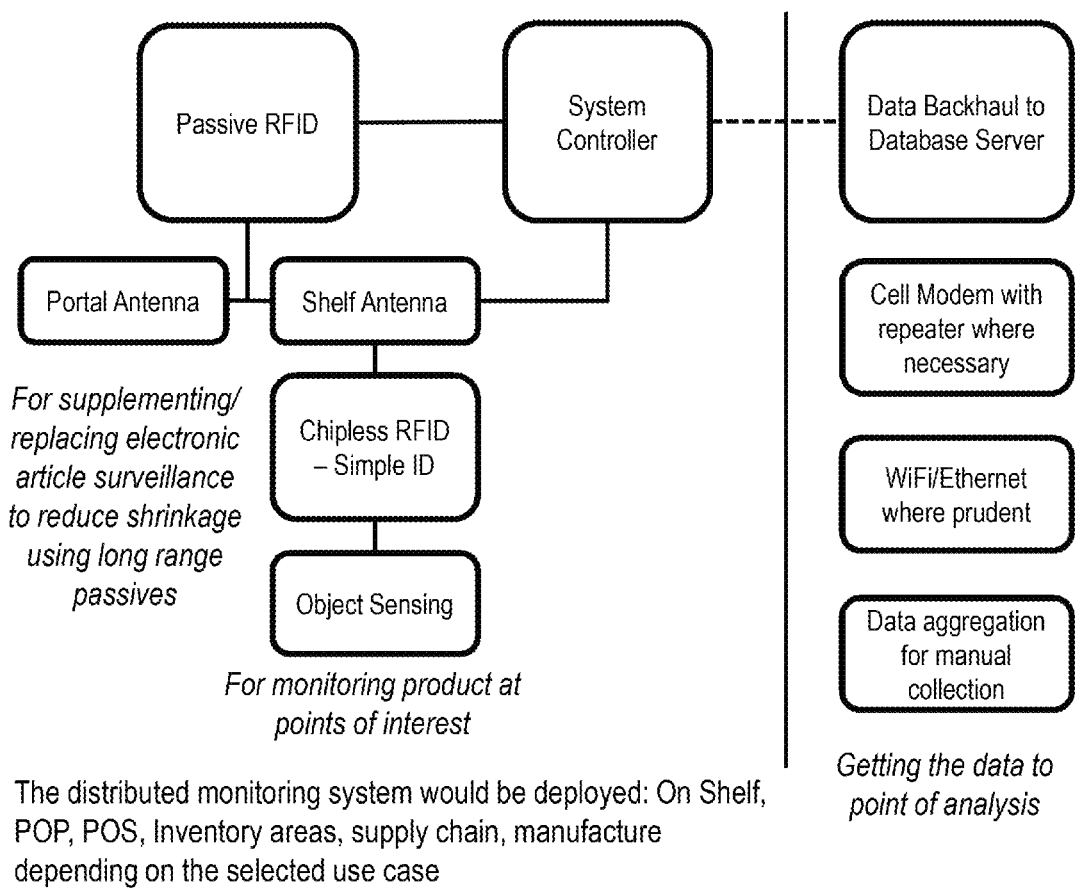
FIG. 8 is a flow chart illustrating, according to some embodiments, the architecture of an exemplary inventory management system.

FIG. 8 is a schematic diagram illustrating the connectivity between monitored products and data collection and analysis systems. Object scanning may be performed for monitoring product at a point of interest. In some embodiments, chipless RFID or a simple ID may be used to identify the product. Information from the scanned object can be transmitted to a shelf antenna, which may communicate with a system controller. The system controller may communicate with a database server. The database server may allow for data aggregation for manual collection.

Figure 9:
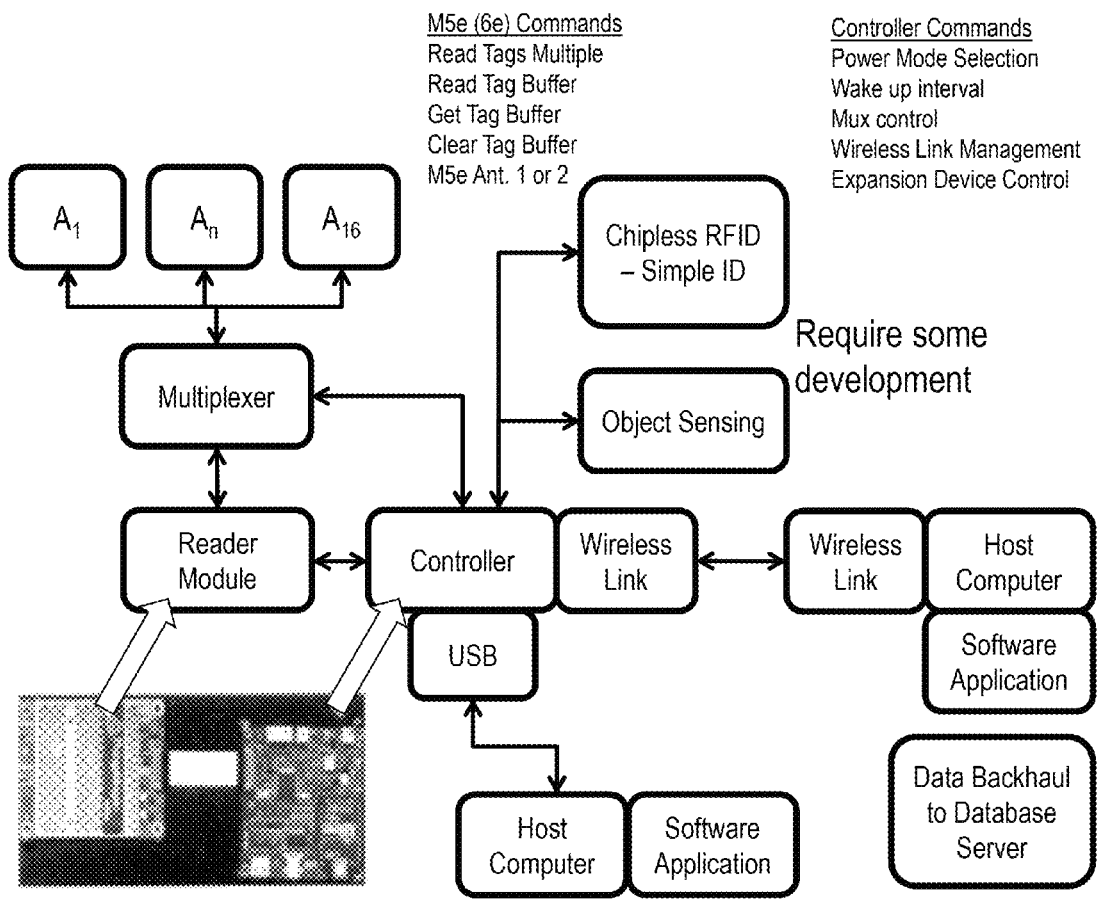
FIG. 9 is, according to certain embodiments, a flow chart illustrating the architecture of an exemplary inventory management system.

FIG. 9 is a schematic diagram illustrating the integration of a reader module into an inventory management system.

Figure 10:
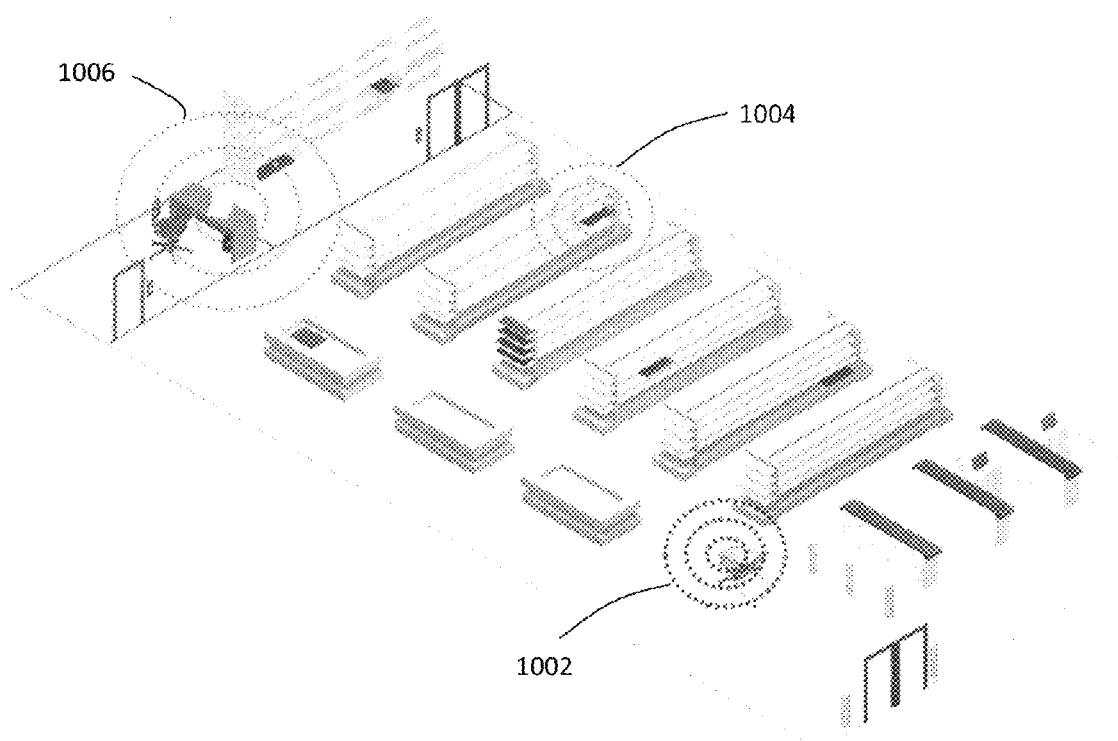
FIG. 10 is a schematic diagram illustrating the deployment of an exemplary inventory management system, according to some embodiments.

FIG. 10 is a schematic illustration of an exemplary inventory monitoring deployment scenario. In FIG. 10, shopper preference monitoring can be performed at region 1002. Distributed read areas may be positioned in region 1004. The distributed read areas may be powered, for example, via Witricity, PoE, a line drop, or any other suitable method. Information may be transmitted to back office area 1006 using a data link.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A system, comprising:
   a display peg comprising a first electrically conductive terminal and a second electrically conductive terminal;
   an object comprising a resistive element having a pre selected resistance, the resistive element in electrical communication with the first electrically conductive terminal and the second electrically conductive terminal when the object is hung from the display peg;
   a source configured to provide a current that flows from the first electrically conductive terminal through the resistive element to the second electrically conductive terminal; and
   an electronic device configured to detect the current flowing from the second electrically conductive terminal,
   wherein the system is configured to identify a type of the object depending on the pre-selected resistance of the resistive element.

2. The system of claim 1, wherein the resistive element makes electrical contact with the electrically conductive terminals of the display peg such that an electrical current is capable of flowing between the electrically conductive terminals via the resistive element.

3. The system of claim 1, wherein the electrical terminals are fashioned using conductive ink.

4. The system of claim 1, wherein the terminals are molded to an outer surface of the display peg.

5. The system of claim 1, wherein the display peg protrudes from a display with which the display peg is electrically coupled.

6. The system of claim 5, wherein the display comprises a pegboard.

7. The system of claim 1, wherein the resistive element is formed using conductive ink.

8. The system of claim 1, wherein the display peg comprises a single rod.

9. The system of claim 1, wherein the display peg comprises two rods.

10. A system for displaying one or more electronically identifiable objects, comprising:
   a display peg;
   two electrically conductive terminals laterally aligned along an upper surface of the display peg, the terminals adapted to permit for an electrical current to flow therebetween when an object, having a pre-selected resistive element printed on a point of contact between the object and the upper surface of the display peg, is hung from the display peg;
   a source configured to provide a current that flows through the two electrically conductive terminals and the resistive element; and
   an electronic device configured to detect the current flowing from one of the electrically conductive terminals,
   wherein the system is configured to identify a type of the object depending on the pre-selected resistance of the resistive element.

11. The system of claim 10, wherein the electrical terminals are fashioned using conductive ink.

12. The system of claim 10, wherein the terminals are molded to an outer surface of the display peg.

13. The system of claim 10, wherein the display peg protrudes from a display with which the display peg is electrically coupled.

14. The system of claim 10, wherein the resistive element is formed using conductive ink.

15. A method of electronically identifying one or more objects hung on a display, the method comprising:
   providing a display peg, the display peg comprising two electrically conductive terminals laterally aligned along an upper surface of the display peg; and
   hanging an object on the display peg, the object comprising a printed resistive element having a pre selected resistance,
   wherein upon hanging the object on the display peg, the resistive element contacts each of the electrically conductive terminals;
   providing an electrical current that flows between the electrically conductive terminals via the resistive element;
   detecting the electrical current that flows from one of the electrically conductive terminals; and
   identifying a type of the object hanging on the display peg depending on the pre-selected resistance of the resistive element.

16. The method of claim 15, comprising providing an electrical signal to the display peg, and interpreting an electrical signal received from the display peg.

17. The method of claim 16, comprising determining a quantity of objects on the peg.

18. The method of claim 15, wherein the electrically conductive terminals are fashioned using conductive ink.

19. The method of claim 15, wherein the resistive element is formed using conductive ink.

* * * * *